United States Patent [19]
Wright

[11] Patent Number: 5,530,402
[45] Date of Patent: Jun. 25, 1996

[54] SINGLE SEQUENTIAL AMPLIFIER CIRCUIT

[75] Inventor: Peter V. Wright, Dallas, Tex.

[73] Assignee: RF Monolithics, Inc., Dallas, Tex.

[21] Appl. No.: 379,865

[22] Filed: Jan. 27, 1995

[51] Int. Cl.⁶ .................................................. H03F 1/14
[52] U.S. Cl. ........................... 330/51; 330/107; 330/110; 330/294
[58] Field of Search .................... 330/9, 51, 107, 330/110, 294

[56] References Cited

U.S. PATENT DOCUMENTS

| | | |
|---|---|---|
| 2,471,252 | 5/1949 | Toulon . |
| 2,629,818 | 2/1953 | Bailey ............................... 330/107 X |
| 2,632,064 | 3/1953 | Onia .................................. 330/107 |
| 3,113,268 | 12/1963 | Horak . |
| 3,921,085 | 11/1975 | Keane . |
| 4,952,832 | 8/1990 | Imai et al. . |
| 4,954,795 | 9/1990 | Choi . |
| 5,099,204 | 3/1992 | Wheatley, III . |
| 5,175,871 | 12/1992 | Kunkel . |

FOREIGN PATENT DOCUMENTS 354587A  2/1990  European Pat. Off. .

Primary Examiner—James B. Mullins
Attorney, Agent, or Firm—Jones, Day, Reavis & Pogue

[57] ABSTRACT

An RF signal amplifier comprising a single stage of amplification coupled through a first switch to the input of a SAW delay line and, after the SAW delay line is charged, through a second switch to the input RF amplifier for second amplification with the output of the RF amplifier being coupled through said first switch to an output terminal.

10 Claims, 2 Drawing Sheets

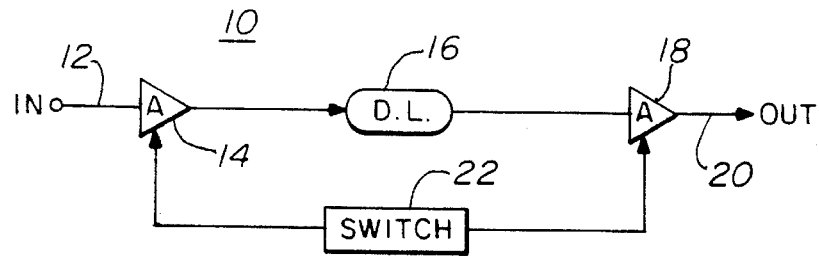
FIG. 1
PRIOR ART
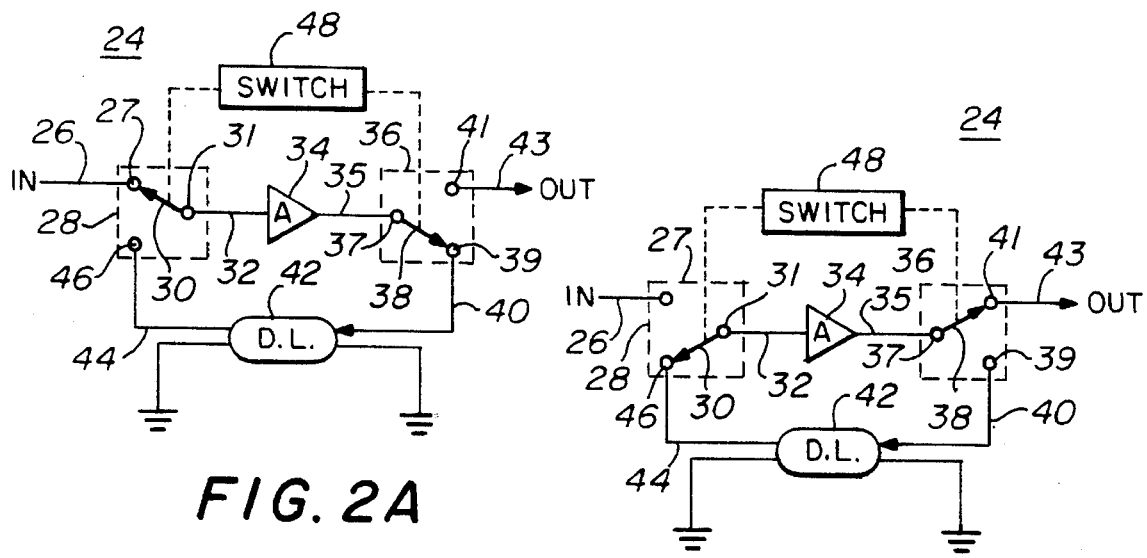
FIG. 2A
FIG. 2B
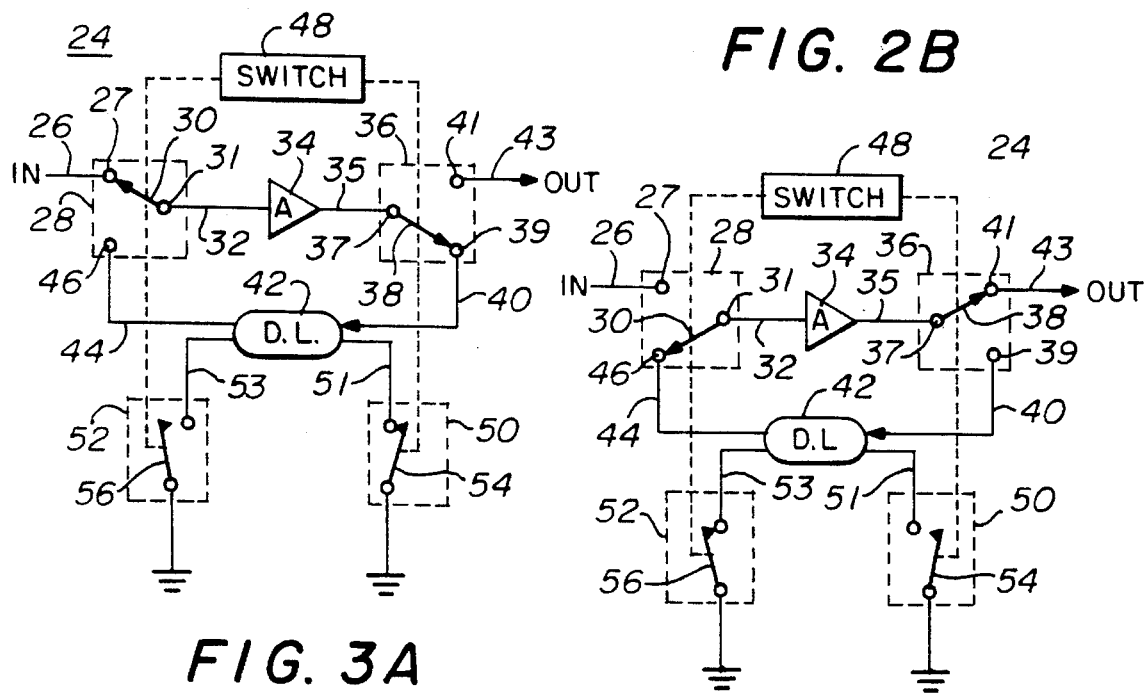
FIG. 3A
FIG. 3B

SINGLE SEQUENTIAL AMPLIFIER CIRCUIT

BACKGROUND OF THE INVENTION

1. Field of the Invention

The present invention relates to amplifiers and in particular to a sequential RF amplifier that utilizes a single amplifier stage that amplifies the incoming signal twice in sequence before transmitting the signal to the output terminal.

2. Description of Related Art

It is well known in the prior art that particularly in handling RF signals and, under certain circumstances, with other signals having a frequency lower than RF frequencies, signal radiation within the amplifying circuit occurs such that if more than two stages of amplification at the same frequency are used, feedback can occur that prevents the circuit from operating. This is overcome in the prior art by utilizing single, double, and triple conversions or more to reduce the frequency to lower levels at each stage so that it can be amplified further without causing the previous amplifying stages or succeeding amplifying stages to oscillate.

As set forth in commonly assigned U.S. Pat. No. 5,357,206 issued Oct. 18, 1994 and entitled "Sequential Amplifier", incorporated herein by reference in its entirety, this problem in the prior art was overcome by utilizing a sequential amplifier in which first and second amplifier stages, both amplifying the same frequency, were coupled to each other by a delay line. During the time the first amplifier stage is operating and amplifying the signal and feeding it into the delay line, the second amplifier stage is turned off. Substantially at the time the amplified signal emerges from the delay line, the first amplifier stage is shut OFF by a switching unit and the second amplifier stage is turned ON. Thus there is no oscillation because only one of the amplifier stages is substantially ON at any one time. This circuit performs its function well. However, as higher frequencies are encountered, limitations begin to occur because the switching of amplifier stages ON and OFF takes time. They do not immediately turn ON or immediately turn OFF. Clearly, then, there is an upper frequency limitation at which the circuit can operate.

SUMMARY OF THE INVENTION

The present invention increases the sampling rate primarily by the use of electronic switches which couple a signal input to a single-stage amplifier receiver and the output of the single-stage amplifier to a delay line of any desired type. As the output signal emerges from the delay line, it is switched to the input of the amplifier and the output of the amplifier is switched to an output terminal. Thus the signal is amplified twice by the same amplifier, which substantially increases the stability of the receiver by reducing the instantaneous gain by a factor of two.

In the event the amplifier has sufficient gain and the switches have insufficient isolation, there may be sufficient feedback to cause oscillation in the loop. If such is the case, in a second embodiment, a third switch may be placed in the ground line of the input port of the two-port delay line and a fourth switch in the ground line of the output port of the delay line. In such case, when the output of the amplifier is coupled to the input port of the delay line, the switch in the ground line of the input port is closed and the switch in the ground line of the output port is opened. When the signal has charged the delay line, the third switch opens on the input port and the fourth switch closes on the output port, thus allowing the output signal to be coupled to the input of the amplifier. The losses across the switches, when they are open, are sufficient to prevent the loop from oscillating. In still another and preferred embodiment, a single-port delay line is coupled to the movable terminal of a single-pole double-throw switch. In one position, the single-port delay line is coupled to the output of the amplifier. When the delay line has been charged and the signal is ready to emerge, the switch is transferred from the output of the amplifier to the input. At the same time, of course, the output of the amplifier is transferred to the output terminal and the input switch to the amplifier is coupled to the single-port delay line. In this instance, there are only three switches involved, the amplifier, the delay fine, and the switch control unit.

Thus it is an object of the present invention to provide a novel amplifier circuit in which the output of a single amplifier stage is coupled to the input of a delay line and, when the delay line is charged, the output of the delay line is coupled to the input of the amplifier and the output of the amplifier is coupled to an output terminal. Thus double amplification is obtained with the use of the same single amplifier stage.

It is still another object of the present invention to provide a single amplifier stage that provides double amplification while utilizing a switch on the input port ground terminal and a switch on the ground line of the output port such that leakage across the switches prevents oscillation of the circuit.

It is yet another object of the present invention to utilize a single amplifier stage for double amplification utilizing a single-port delay line.

Thus the present invention relates to a circuit including a signal amplifier comprising a signal input terminal and a signal output terminal, a single amplifier stage having an input and an output, a delay line, controlled switch means for coupling an input signal on the signal input terminal directly to the input of the single amplifier stage for a first amplification and the output of a single amplifier stage directly to the delay line to temporarily store the amplified signal, and the controlled switch means subsequently coupling only the temporarily stored signal in the delay line directly to the single amplifier input for a second amplification and only the second amplified output of a single amplifier to the output terminal. It will be obvious to one skilled in the art that the duty cycle of this circuit can be varied up to 50%.

BRIEF DESCRIPTION OF THE DRAWINGS

These and other features of the present invention will be more fully disclosed when taken in conjunction with the following DETAILED DESCRIPTION OF THE DRAWINGS in which like numerals represent like elements and in which:

FIG. 1 represents the sequential amplifier of the prior art;

FIG. 2A is a circuit diagram of the present invention in a first state illustrating the input signal being gated through the amplifier to the delay line;

FIG. 2B represents the circuit of FIG. 2A in a second state after the delay line has been charged or loaded with the input signal and illustrating the gating of the output of the delay line to the input of the same amplifier stage for a second amplification with the output of the amplifier stage being gated to the output terminal;

FIG. 3A illustrates a diagrammatic representation of a first alternate embodiment of the present invention to prevent oscillation of the circuit by placing a first switch in the ground line of the input port of a two-port delay line and a second switch in the ground line of the output port of the delay line such that when the delay line is being charged or loaded with the output of the single-stage amplifier, the input port switch is closed and the output port switch is open thereby reducing leakage current to the input of the amplifier and preventing oscillation of the loop;

FIG. 3B is a circuit illustration of the circuit of FIG. 3A illustrating the switch in the input port ground line of the delay line in the open state while the switch in the ground line of the output port of the delay line is closed thereby allowing the signal stored by the delay line to be gated to the input of the single amplifier stage for a second amplification;

DETAILED DESCRIPTION OF THE DRAWINGS

Figure 4A:
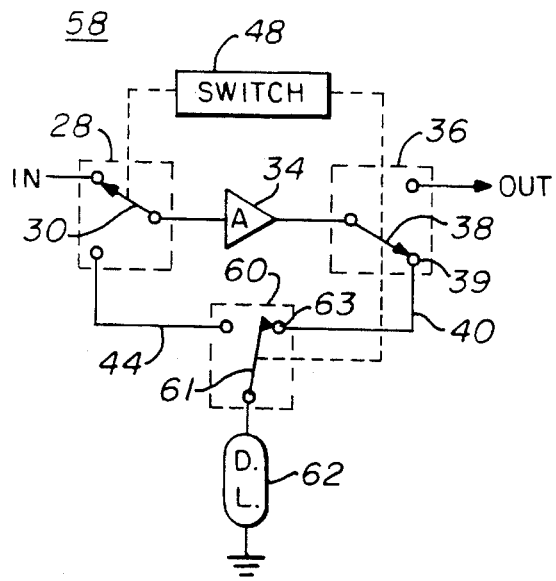
FIG. 4A is a circuit illustration of a second embodiment of the present invention, which is the preferred embodiment, in which a single-port delay line is alternately gated between the output of the single-stage amplifier where it is charged or loaded with the input signal and the input of the single-stage amplifier through a single-pole double-throw switch for a second amplification and such that the leakage current to the input of the amplifier is insufficient to cause the amplifier loop to oscillate.

FIG. 1 is a diagrammatic circuit representation of the prior art sequential amplifier disclosed in commonly assigned U.S. Pat. No. 5,357,206 issued Oct. 18, 1994 and entitled "Sequential Amplifier". In FIG. 1, the circuit 10 includes a signal input terminal 12, a first amplifier stage 14 having its output coupled to a delay line 16 and a second amplifier stage 18 for receiving the output of the delay line 16 and generating an output signal on output terminal 20. A control unit 22 alternately switches amplifiers 14 and 18 OFF and ON. Thus, when amplifier 14 is ON, the second amplifier 18 is OFF. The input signal on line 12 is then amplified by amplifier 14 and stored in delay line 16. As indicated in copending application Ser. No. 07/008,522, the delay line may be of any well-known type but is preferably a surface acoustic wave (SAW) delay line. As the signal begins to emerge from the delay line 16, control unit 22 shuts OFF amplifier 14 and turns ON amplifier 18. Amplifier 18 then, again, amplifies the signal received from the delay line 16 and generates the amplified output on output terminal 20. The cycle then repeats itself. In this fashion, there can be no oscillation between amplifiers 14 and 18 inasmuch as when one is ON, the other is essentially OFF. This is disclosed in detail in the commonly assigned U.S. Pat. No. 5,357,206 issued Oct. 18, 1994 and entitled "Sequential Amplifier", which is incorporated herein by reference in its entirety. The circuit in FIG. 1 works well for the purpose for which it was intended. However, it is limited in its data rate or sampling rate since, as is well known in the art, amplifiers 14 and 18 do not turn ON and OFF substantially instantaneously. Consequently, the limit of the frequency of operation is determined by the turn-ON and turn-OFF times of the amplifiers 14 and 18.

It is well known that switches, however, can be actuated at 5 nanoseconds or less. Thus a circuit operating on the principles of the circuit in FIG. 1 could be made much simpler and also be made to operate at much higher frequencies if switches were utilized to couple signals to the proper circuits because they can be turned ON and OFF so quickly. Such a circuit is disclosed in FIG. 2A. Circuit 24 includes a signal input line 26 coupled to a first terminal 27 of a first single-pole double-throw switch 28. The input signal is coupled to movable contact arm 30 of first switch 28 that is connected to a second terminal 31 of switch 28 and to input line 32 of amplifier stage 34 for amplification. The output signal from amplifier stage 34 on line 35 is gated to a first terminal 37 of a second single-pole, double-throw switch 36. Movable arm 38 of switch 36 couples the signal from first terminal 37 to a second terminal 39 and line 40 to the input of two-port delay line 42 to charge the delay line 42 with the amplified signal.

When the amplified signal has been stored in delay line 42, the switches 28 and 36 change as indicated in FIG. 2B. Switch controller 48 causes movable arm 30 of first switch 28 to move to third terminal 46 thus gating the output port of delay line 42 and the stored signal thereof on line 44 to the input line 32 of single amplifier stage 34. Simultaneously, the movable arm 38 of the second switch 36 is moved by switch controller 48 to a third terminal 41 which gates the output of the amplifier 34 to output line or terminal 43. Thus the single amplifier stage 34 gives a double amplification. Yet the circuit works much faster than that illustrated in FIG. 1 because the switches 28 and 36 can be operated by the switch controller 48 in 5 ns or less.

In the event that insufficient isolation in switches 28 and 36 in FIGS. 2A and 2B is sufficient to cause oscillation of the circuit, additional isolation can be achieved with the circuit of FIGS. 3A and 3B. As shown in FIG. 3A, the modification to the circuit includes a first switch 50 in the ground line 51 of the input port of the delay line 42 and a switch 52 in the ground line 53 of the output port of delay line 42. The switch control unit 48 operates these switches 50 and 52 simultaneously with switches 28 and 36. Thus when switch 28 is operated to gate the input signal to the input of amplifier 34 and switch 36 couples the output of amplifier 34 to the input port of delay line 42, switch 50 has its movable contact 54 closed by switch control unit 48 thus completing a circuit to ground and allowing the amplified signal from amplifier 34 to be coupled to the input of delay line 42. However, switch 52 in the ground line 53 of the output port of delay line 42 is opened by switch control unit 48 thus disabling the output of the delay line 42. After the delay line 42 is charged with the signal from amplifier 34, as shown in FIG. 3B, switches 50 and 52 are reversed by switch control unit 48 at the same time the switches 28 and 36 are reversed. Thus the movable contact 54 of switch 50 on the input port to delay line 42 is opened substantially limiting any leakage current through switch 36 from being substantially coupled to the delay line 42 while movable contact 56 of switch 52 in the ground line of the output port of delay line 42 is closed thus allowing the stored signal in delay line 42 to be gated through switch 28 to the input of amplifier 34 and the output of amplifier 34 to be gated to the output terminal 43 through switch 36. Although the total amplification may now be 100 db, any leakage through switches 36 and 50 and switches 28 and 52 will cause sufficient isolation so as to prevent oscillation of the loop. Therefore, the circuit shown in FIGS. 3A and 3B can be used with low-loss two-port delay lines.

Figure 4B:
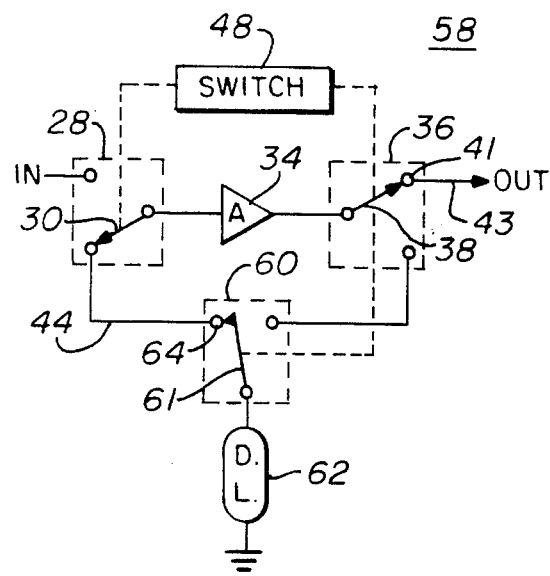
FIG. 4B is an illustration of the circuit in FIG. 4A in which the charged single-port delay line is gated to the input of the single-stage amplifier for a second amplification.

The preferred embodiment of the present invention is illustrated in FIGS. 4A and 4B wherein a single-port delay line is used. Thus as can be seen in FIG. 4A, switch 60 gates the single-port delay line 62 through switchable contact 61 to line 40 that is coupled through switch 36 to the output of amplifier 34. Thus in this position, amplifier 34 charges the single-port delay line 62. When the stored signal is due to emerge from the delay line, switch controller 48 changes the switch positions of each of the switches 28, 36, and 60. Now, the signal stored in single-port delay line 62 is coupled as illustrated in FIG. 4B through switch contact 64 to line 44 and through switch 28 to the input of amplifier 34. Again, the output of amplifier 34 is coupled through switch 36 to output terminal 43. In this instance, only one additional switch is required for the single-port delay line 62. Thus in the circuits of FIGS. 4A and 4B, the number of elements is reduced, the cost of the circuit is reduced, and the same efficiency is obtained. A single-port delay line 62 may be of the type disclosed in commonly assigned U.S. application Ser. No. 335,036 filed Nov. 7, 1994 and incorporated herein by reference in its entirety. An additional advantage of this circuit is that only one matching network is required.

Figure 5A:
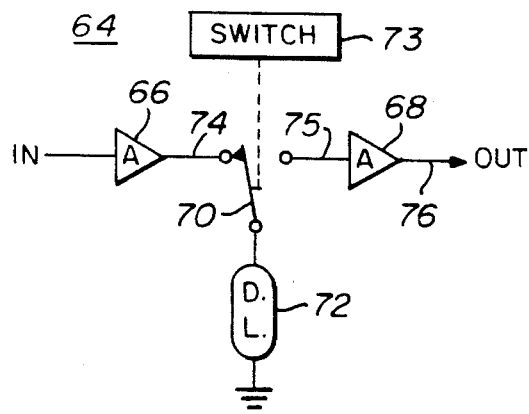
FIG. 5A is a diagrammatic representation of still another embodiment of the present invention in which the output of a first amplifier is gated to a single-port delay line to charge or load the delay line and FIG. 5B illustrates the gating of the charged or loaded delay line from the output of the first amplifier stage to the input of a second amplifier stage for a second amplification.
Figure 5B:
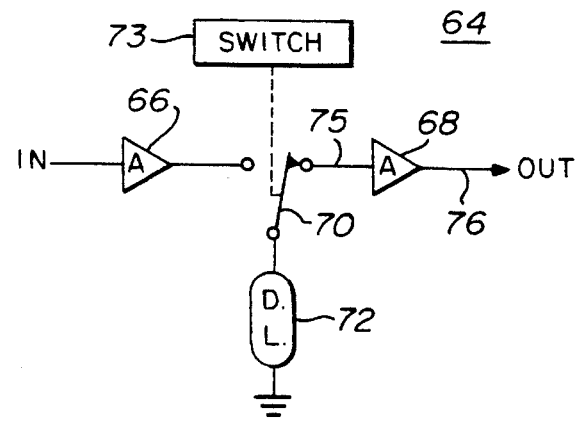

FIGS. 5A and 5B illustrate an improvement over the circuit disclosed in commonly assigned U.S. Pat. No. 5,357,206. The amplifier circuit 64 shown in FIG. 5A and FIG. 5B includes two signal amplifier stages 66 and 68. The output of amplifier stage 66 is coupled on line 74 and switchable contact 70 to a single-port delay line 72 to charge the delay line and store the amplified signal. When the single-port delay line 72 is charged, switch controller 73 couples switchable contact 70 to line 75, the input of the second amplifier stage 68 as shown in FIG. 5B, and the stored signal is again amplified and amplifier stage 68 generates output on line 76.

As will be noted in FIG. 5A and FIG. 5B, both amplifier stages 66 and 68 are ON all the time even though the signal from only one amplifier stage is used during any one time period. Thus when amplifier stage 66 is amplifying a signal that is being coupled to the single-port delay line 72, the second amplifier stage 68 in ON but no signal is being coupled to its input. When switch 70 couples the output of the delay line 72 to the input of second stage 68, the first amplifier stage 66 is still ON but its output is coupled to an open circuit. Thus power is being used needlessly in one of the stages at any given time.

Figure 6A:
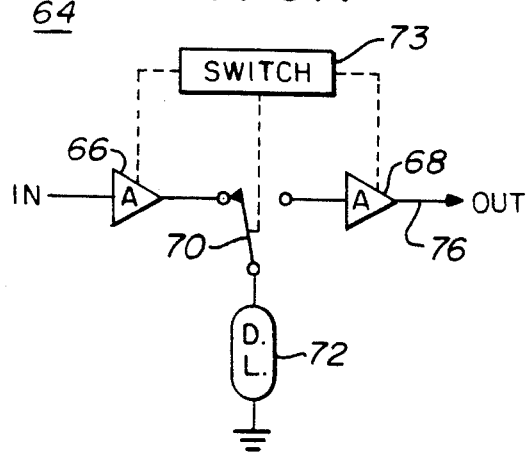
FIG. 6A is a diagrammatic representation of yet another embodiment of the present invention in which amplifier power is conserved by gating OFF the second amplifier stage while the first amplifier stage is charging the delay line.
Figure 6B:
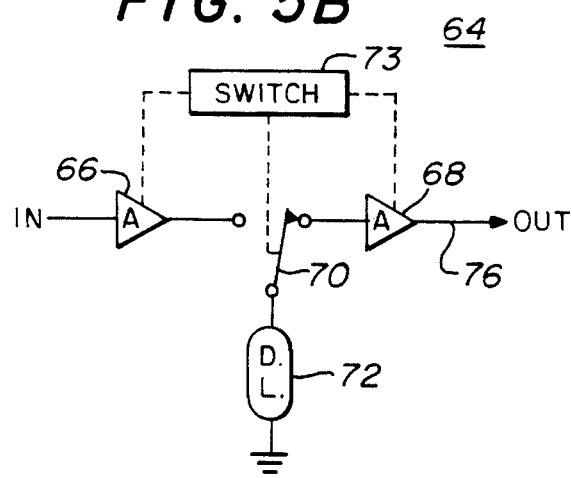
FIG. 6B illustrates the circuit of FIG. 6A after the delay line has been charged, the first amplifier gated OFF, and the second amplifier gated ON to receive and amplify the signal stored in the delay line.

The circuit of FIGS. 6A and 6B overcomes that problem by having switch controller 73 also turn the amplifier stages 66 and 68 ON and OFF in synchronism with the switchable contact 70. Thus when switchable contact 70 is coupled to the output of the first amplifier stage 66, switch controller 73 also turns ON the first amplifier stage 66 and turns OFF the second amplifier stage 68. When switch controller 73 causes the switchable contact 70 to couple the output of the delay line 72 to the input of the second amplifier stage 68, it also turns ON second amplifier stage 68 and turns OFF the first amplifier stage 66. Thus power is saved by sacrificing speed of operation. As stated earlier, the amplifier stages 66 and 68 cannot be turned ON and OFF as quickly as switches can be.

Thus, there has been disclosed a novel amplifier circuit which may be used at any desired frequency but particularly at RF frequencies in which a single amplifier provides a double amplification of the signal. A delay line is coupled to the output of the amplifier to store the first amplified signal of the output amplifier. When the signal is set to emerge from the delay line, a switch controller causes the output of the delay line to be coupled to the input of the amplifier for a second amplification and the output of the amplifier is coupled to an output terminal. Oscillation is eliminated through the use, first, of a two-port delay line with switches in the ground lines in both the input port and the output port. When the delay line is being charged, the switch on the input port is closed and the switch on the output port is opened. After the delay line has received the full signal charge, the switch in the input port is opened and the switch in the output port ground line is closed thus coupling the output of the delay line to the input of the amplifier for a second amplification. These switches has sufficient leakage loss to prevent oscillation of the circuit.

In the preferred embodiment, a single-port delay line is coupled through a switch alternately to the output of the amplifier and, after being charged, to the input of the amplifier for a second amplification.

While the invention has been described in connection with a preferred embodiment, it is not intended to limit the scope of the invention to the particular form set forth, but, on the contrary, it is intended to cover such alternatives, modifications, and equivalents as may be included within the spirit and scope of the invention as defined by the appended claims.

I claim:

1. An RF signal amplifier comprising:

a signal input terminal and a signal output terminal;

a single RF amplifier stage having an input and an output;

a delay line having only one input and one output;

controlled switch means for coupling an input signal on said signal input terminal directly to the input of said single RF amplifier stage for a first amplification and successively coupling the output of the single RF amplifier stage directly to said delay line input to temporarily store said amplified signal; and said controlled switch means subsequently coupling only the temporarily stored signal from the output of said delay line directly to said single RF amplifier input for a second amplification and only the second amplified output of the single RF amplifier to said output terminal.

2. An RF amplifier as in claim 1 wherein said delay line is a surface acoustic wave delay line having only two ports, one port selectively connected to the output of said single RF amplifier stage for receiving and storing the amplified signal and the other port selectively coupled to the input of said single RF amplifier stage for coupling the stored amplified signal to the input of said single RF amplifier stage for said second amplification.

3. An RF amplifier as in claim 2 wherein said controlled switch means further comprises:

a first switch for selectively and sequentially coupling substantially either only the input signal or only the output signal of the second port of the SAW delay line to the input of said single amplifier stage; and a second switch for selectively and sequentially coupling the output signal of said single amplifier stage substantially only to either the signal output terminal or only to the input to said SAW delay line such that, in a first switch condition, said single amplifier stage amplifies said input signal and, in a second switch condition, the single-stage amplifier amplifies the stored signal in said SAW delay line thereby having a double amplification with a single signal and a single amplifier stage.

4. An RF amplifier as in claim 1 wherein said delay line further comprises:

a two-port surface acoustic (SAW) delay line with a first port having an input terminal and a first ground terminal line for receiving an input signal; and a second port having an output terminal and a second ground terminal line for generating a delayed output signal.

5. An RF amplifier as in claim 4 wherein the controlled switch means further comprises:

a third switch in the first ground terminal line of the first port of the SAW delay line for enabling said first port of said SAW delay line only when said output signal from said single RF amplifier is coupled to said first port; and a fourth switch in the second ground terminal line of the SAW delay line for enabling said second port of said SAW delay line only when said output signal from said single RF amplifier is coupled to said output terminal.

6. An RF amplifier as in claim 1 wherein said SAW delay line further comprises a single-port SAW delay line.

7. An RF amplifier as in claim 6 wherein said controlled switch means comprises:

a first switch for selectively and sequentially coupling substantially only the input signal or only the single-port SAW delay line to the input of the single RF amplifier stage;

a second switch synchronized with said first switch for selectively and sequentially coupling the amplified output signal of said single RF amplifier stage substantially only to either the signal output terminal or only to said single port SAW delay line; and a third switch synchronized with both said first and second switches for alternately coupling said single-port SAW delay line first to said single RF amplifier stage output through said second switch for storing said amplified signal and then to the input of said single RF amplifier stage through said first switch for coupling the stored amplified signal to the input of said single RF amplifier for amplifying said signal the second time.

8. An electrical RF signal amplifier comprising:

a single RF amplifier stage having an input and an output;

a first single-pole double-throw switch having first, second, and third terminals, the first terminal being coupled to the input of said RF amplifier for selectively coupling to either one of the second and third terminals;

a SAW delay line having a single input and a single output;

a second single-pole double-throw switch having first, second, and third terminals, the first terminal of the second switch being coupled to the output of said RF amplifier for selectively coupling to either one of the second and third terminals of the second switch;

a signal input coupled to the second terminal of said first switch;

the output of said SAW delay line being coupled to the third terminal of said first switch;

a signal output line coupled to the second terminal of said second switch;

the input of said SAW delay line being coupled to the third terminal of said second switch; and switch control means coupled to said first and second switches for coupling said signal input to said RF amplifier input to provide a first amplification of said signal and said RF amplifier output to said SAW delay line input to load said signal output of said RF amplifier into said SAW delay line and subsequently switching the output of said SAW delay line to the input of said RF amplifier and the output of said RF amplifier to said second terminal of said second switch to provide a second amplification of said signal with said single RF amplifier stage.

9. An RF signal amplifier comprising:

a first RF amplifier stage having an input and an output;

a single-port SAW delay line;

a switch having contact means switchable between first and second positions;

a second RF amplifier stage having an input and an output;

switch control means for coupling the switchable contact means between the output of said first RF amplifier stage and said SAW delay line to charge said SAW delay line; and said switch control means, after the SAW delay line has been charged or loaded with said amplified signal, coupling said switchable contact means between the SAW delay line and the input to said second RF amplifier stage for allowing said stored signal to be reamplified in said second RF amplifier stage.

10. An RF amplifier as in claim 9 wherein said switch control means turns said first RF amplifier stage ON and said second RF amplifier stage OFF when charging said SAW delay line and for turning said first RF amplifier OFF and said second RF amplifier stage ON when said SAW delay line is coupled to the input of said second RF amplifier stage.

* * * * *